(12) United States Patent
Takahashi et al.

(10) Patent No.: US 7,675,096 B2
(45) Date of Patent: Mar. 9, 2010

(54) SOLID-STATE IMAGE PICKUP ELEMENT AND METHOD OF PRODUCING THE SAME

(75) Inventors: Hiroki Takahashi, Miyagi (JP); Noriaki Suzuki, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 504 days.

(21) Appl. No.: 11/392,718

(22) Filed: Mar. 30, 2006

(65) Prior Publication Data
US 2006/0221800 A1      Oct. 5, 2006

(30) Foreign Application Priority Data
Mar. 30, 2005   (JP)   .......................... P2005-099764

(51) Int. Cl.
*G11B 7/00*   (2006.01)
(52) U.S. Cl. .................. 257/292; 257/187; 257/184; 257/461; 257/259; 257/E27.082
(58) Field of Classification Search .............. 257/184, 257/259, 292, 461, E27.082
See application file for complete search history.

(56) References Cited

U.S. PATENT DOCUMENTS

| | | | |
|---|---|---|---|
| 6,259,083 B1 * | 7/2001 | Kimura .................... | 250/208.1 |
| 6,831,311 B2 * | 12/2004 | Uchida ........................ | 257/290 |
| 6,852,565 B1 * | 2/2005 | Zhao ............................ | 438/73 |
| 6,903,395 B2 * | 6/2005 | Nakai et al. .................. | 257/294 |
| 2005/0045975 A1 * | 3/2005 | Kondo et al. ................. | 257/414 |
| 2005/0087784 A1 * | 4/2005 | Lee et al. ..................... | 257/294 |
| 2005/0127415 A1 * | 6/2005 | Yuzurihara et al. .......... | 257/292 |
| 2006/0115230 A1 * | 6/2006 | Komoguchi et al. ........ | 385/146 |
| 2007/0018212 A1 * | 1/2007 | Shibayama .................. | 257/292 |

FOREIGN PATENT DOCUMENTS

JP    2000-164837 A    6/2000

* cited by examiner

*Primary Examiner*—Wael Fahmy
*Assistant Examiner*—Marc Armand
(74) *Attorney, Agent, or Firm*—Birch, Stewart, Kolasch & Birch, LLP.

(57) ABSTRACT

A solid-state image pickup element comprises: a semiconductor substrate; an imaging section comprising a photoelectric converting portion, formed on the semiconductor substrate; an intralayer lens formed in an upper layer of the imaging section; and a peripheral circuit section that processes an output of the imaging section, formed on the semiconductor substrate, wherein at least part of the intralayer lens is formed in a lower layer of a wiring portion in the peripheral circuit section.

6 Claims, 7 Drawing Sheets

SOLID-STATE IMAGE PICKUP ELEMENT AND METHOD OF PRODUCING THE SAME

BACKGROUND OF THE INVENTION

1. Field of the Invention

The present invention relates to a solid-state image pickup element and a method of producing it, and more particularly to formation of an intralayer lens.

2. Description of the Related Art

Recently, in solid-state image pickup elements, increase of the number of imaging pixels is advanced to the level of gigapixels or more, and miniaturization of an element is going on progressing. Under such circumstances, the sensitivity is requested to be improved. However, an on-chip lens which is formed on a color filter and in the uppermost layer is not sufficient for improving the sensitivity. A technique has been proposed in which a lens (intralayer lens) is further formed between an on-chip lens and a sensor portion, thereby enhancing the light converging function. As an example of such an intralayer lens, there is a convex superior portion which is formed on a face planarized by filling a step caused by a transfer electrode or the like, and in which the surface side is formed as a convex face.

As an example of a method of producing such a convex superior portion, there is a method in which a stacked layer of a film of a lens material for the convex superior portion and a resist is dry etched. In the method, a film of the lens material is deposited, the resist on the film is patterned into a shape of the lens, and the lens shape of the resist is transferred to the lens material film by dry etching.

Another method of enhancing the sensitivity by adjusting the focal length of a lens to a desired length in a wide range has been proposed (JP-A-2000-164837).

In this method, a resist mask having a shape of a lens is formed on a layer of a material for an intralayer lens, the lens shape of the resist mask is transferred to the layer of the intralayer lens material by the etch back method, thereby forming an intralayer lens, and the focal length is adjusted by the etch back amount.

When an intralayer lens is disposed below an on-chip lens formed by a microlens as described above, incident light is converged in two steps to enable a larger amount of light to enter a light receiving portion. The sensitivity of a solid-state image pickup element can be enhanced as compared with the case where only an on-chip lens is formed.

In this way, the height of an intralayer lens of a solid-state image pickup element can adjust the focal length by means of controlling the etch back amount. The intralayer lens is formed by a method which is performed after formation of metal wiring, and in which the lens material is used also as a wiring protective film (passivation film). In a step of forming the lens, when the lens thickness is reduced in the process of etching back the lens material, also the passivation film for a wiring portion is thinned, and the wiring portion may be exposed. Therefore, the film thickness has limitations, and reduction of the height of the intralayer lens is restricted. Also when the lens material is not used also as the wiring protective film, the irregularity of the surface of the wiring portion may cause the accuracy of a step of patterning the lens or the like to be reduced.

SUMMARY OF THE INVENTION

The invention has been conducted in view of the above-discussed circumstances. It is an object of the invention to provide a solid-state image pickup element in which the height of an intralayer lens can be freely adjusted, which has high sensitivity, and which is highly reliable.

The solid-state image pickup element of the invention comprises: a semiconductor substrate; an imaging section comprising a photoelectric converting portion and a charge transferring portion that transfers a charge produced in the photoelectric converting portion, the imaging section being formed on the semiconductor substrate; an intralayer lens formed in an upper layer of the imaging section; and a peripheral circuit section that processes an output of the charge transferring portion and is formed on the semiconductor substrate, wherein at least part of the intralayer lens is formed in a lower layer of a wiring portion in the peripheral circuit section.

According to the configuration, the thickness of the intralayer lens can be adjusted without being affected by the thickness of a passivation film of the wiring portion, and hence the optical design can cope with more conditions.

In the solid-state image pickup element of the invention, the intralayer lens comprises a convex inferior portion and a convex superior portion, and the wiring portion of the peripheral circuit section is formed in an upper layer of the convex inferior portion, and is formed in a lower layer of the convex superior portion.

According to the configuration, the wiring portion is formed in the intralayer lens consisting of the convex inferior portion and the convex superior portion, and hence the reliability can be further improved.

In the solid-state image pickup element of the invention, a passivation film which covers the wiring portion of the peripheral circuit section configures the convex superior portion.

According to the configuration, the passivation film functions also as the intralayer lens, and therefore the number of production steps can be reduced.

In the solid-state image pickup element of the invention, the intralayer lens comprises a convex inferior portion and a convex superior portion, and the wiring portion of the peripheral circuit section is formed in an upper layer of the convex inferior portion and the convex superior portion.

According to the configuration, the height of the intralayer lens can be freely adjusted, and a wiring portion of high reliability can be formed.

In the solid-state image pickup element of the invention, the wiring portion is connected to a gate electrode of the peripheral circuit section via a plug.

In the solid-state image pickup element of the invention, a sidewall of the convex inferior portion is covered by a light blocking film.

According to the configuration, a sidewall of the convex inferior portion is covered by a light blocking film, and hence light leakage to the charge transferring portion can be prevented from occurring.

In the solid-state image pickup element of the invention, the passivation film is a resin film.

According to the configuration, the solid-state image pickup element can be processed easily.

In the solid-state image pickup element of the invention, the passivation film is an inorganic film.

According to the configuration, the protectivity is high, and the reliability can be improved.

The method of producing a solid-state image pickup element of the invention comprises: a semiconductor substrate; an imaging section comprising a photoelectric converting portion and a charge transferring portion that transfers a charge produced in the photoelectric converting portion, the imaging section being formed on the semiconductor substrate; and a peripheral circuit section that processes an output of the charge transferring portion, the peripheral circuit section being formed on the semiconductor substrate, the method comprising: a step of forming an intralayer lens in an upper layer of the imaging section; and a step of forming a wiring portion which is to be connected from the imaging section to the peripheral circuit section, in an upper layer of the intralayer lens.

According to the configuration, in the formation of the intralayer lens, the height (the thickness of the lens) can be freely adjusted without being affected by the thickness of a passivation film of the wiring portion.

In the method of producing a solid-state image pickup element of the invention, the step of forming the intralayer lens comprises: a step of forming a convex inferior portion; and a step of forming a convex superior portion, and the step of forming the wiring portion is executed after the step of forming the convex inferior portion.

According to the configuration, also in the etching back step in the formation of the convex inferior portion, the wiring portion can be formed without a fear of being exposed.

In the method of producing a solid-state image pickup element of the invention, the step of forming the convex superior portion is executed after formation of the wiring portion of the peripheral circuit section.

According to the configuration, in the formation of the intralayer lens, the height (the thickness of the lens) can be freely adjusted without being affected by the thickness of a passivation film of the wiring portion.

In the method of producing a solid-state image pickup element of the invention, the step of forming the convex superior portion comprises a step of forming the convex superior portion so as to cover the wiring portion in the peripheral circuit section, and, on the wiring portion, patterning the convex superior portion as a passivation film.

According to the configuration, also in the etching back step in the formation of the convex inferior portion, the wiring portion can be formed without a fear of being exposed.

In the method of producing a solid-state image pickup element of the invention, the step of forming the wiring portion is executed after the step of forming the convex superior portion.

According to the configuration, the passivation film can be formed without depending on the film thickness of the convex superior portion.

In the method of producing a solid-state image pickup element of the invention, the step of forming the wiring portion includes a step of forming a contact hole, and connecting the wiring portion to a gate electrode of the peripheral circuit section via a plug formed in the contact hole.

According to the configuration, the plug which is to be connected to the gate electrode is formed in an upper layer portion. Therefore, the number at which a conductor layer coupled to the gate electrode is exposed to plasma is greatly reduced, and gate destruction caused by plasma damage can be prevented from occurring.

In the method of producing a solid-state image pickup element of the invention, the step of forming the wiring portion comprises a step of performing a patterning process so as to leave an electrically conductive film configuring a wiring layer in peripheral circuit and so as to cover the sidewall of the convex inferior portion with a light blocking film.

According to the configuration, the light blocking film can be formed on the sidewall of the convex inferior portion in the step of patterning the wiring layer. Therefore, a solid-state image pickup element having excellent optical characteristics can be formed without increasing the number of production steps.

DETAILED DESCRIPTION OF THE INVENTION

Hereinafter, embodiments of the invention will be described in detail with reference to the accompanying drawings.

Embodiment 1

Figure 1:
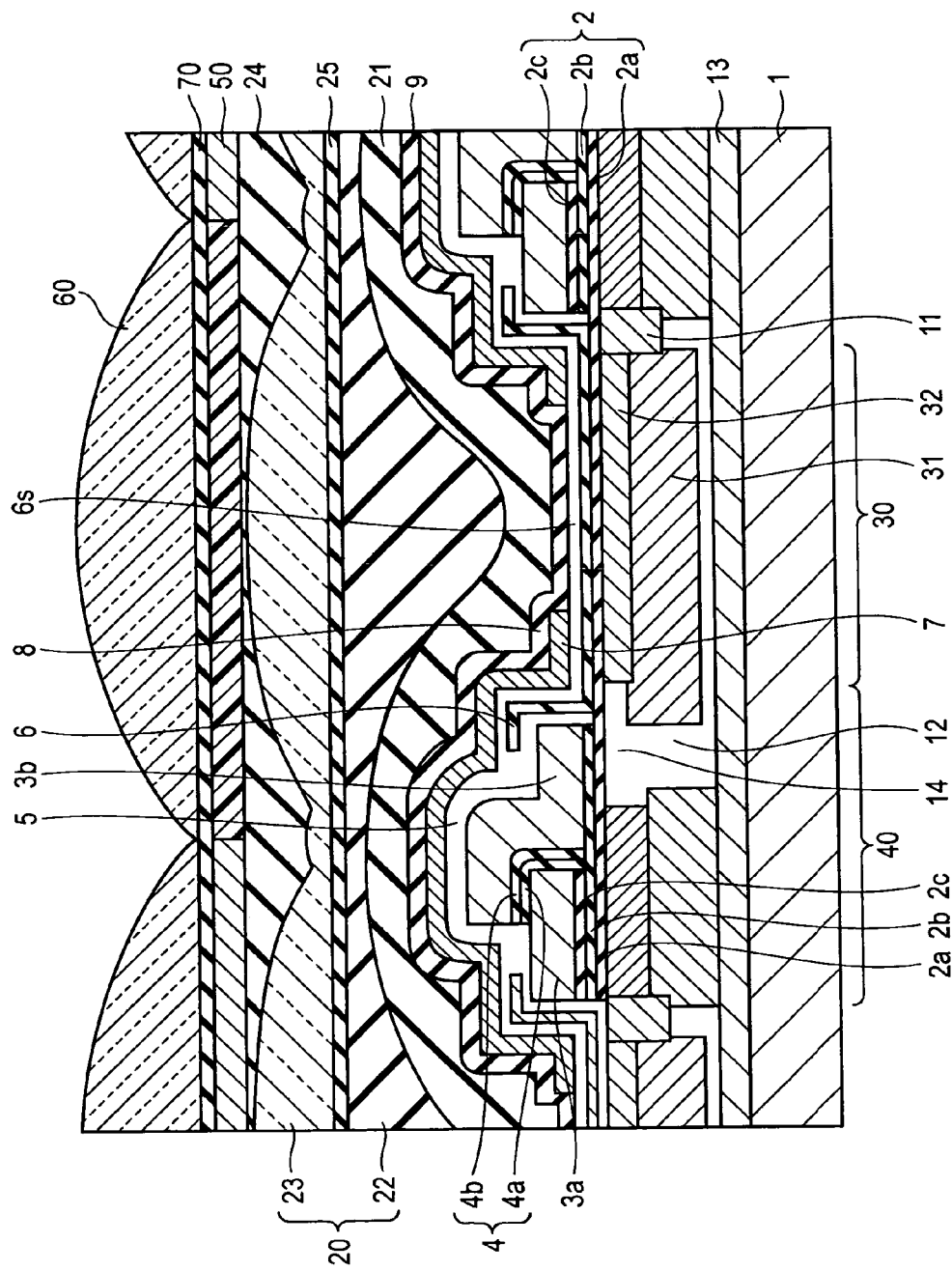
FIG. 1 is a section view showing a solid-state image pickup element of Embodiment 1 of the invention.
Figure 2:
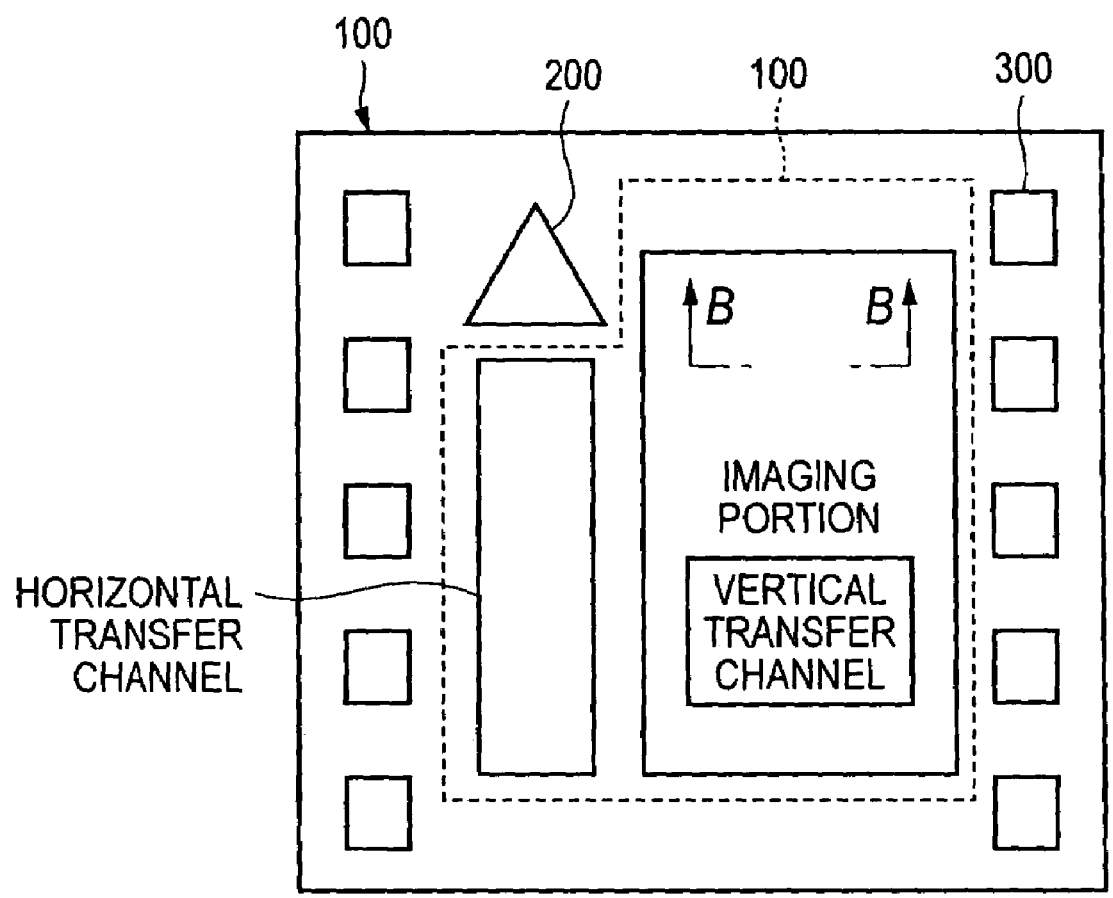
FIG. 2 is a plan view showing the solid-state image pickup element of Embodiment 1 of the invention.
Figure 3:
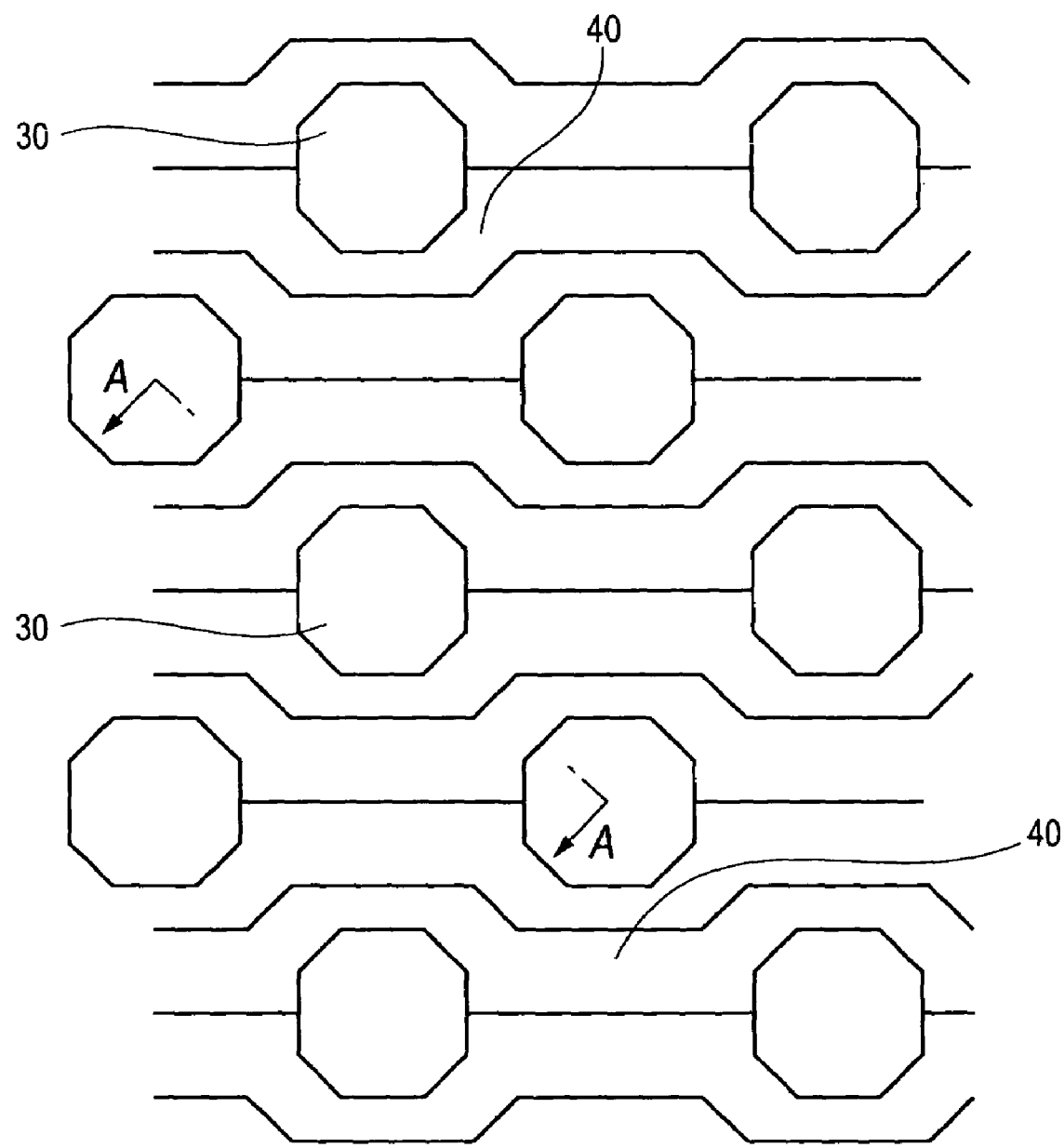
FIG. 3 is a section view showing a main portion of the solid-state image pickup element of Embodiment 1 of the invention.
Figure 4A:
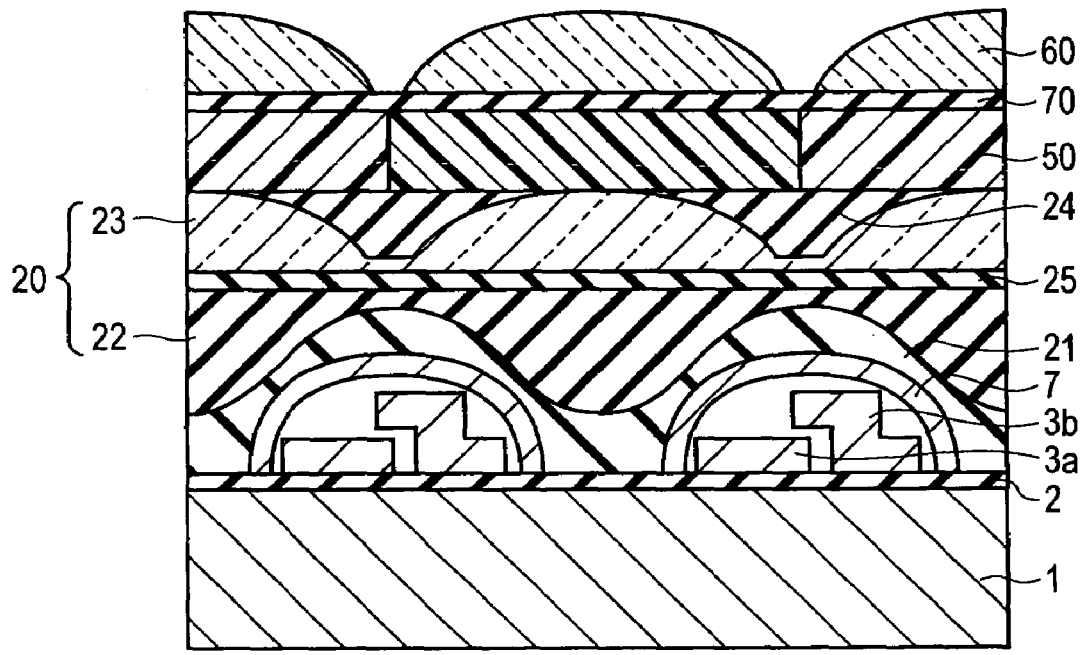
FIGS. 4A and 4B are diagrams showing a main portion of the solid-state image pickup element of Embodiment 1 of the invention.
Figure 4B:
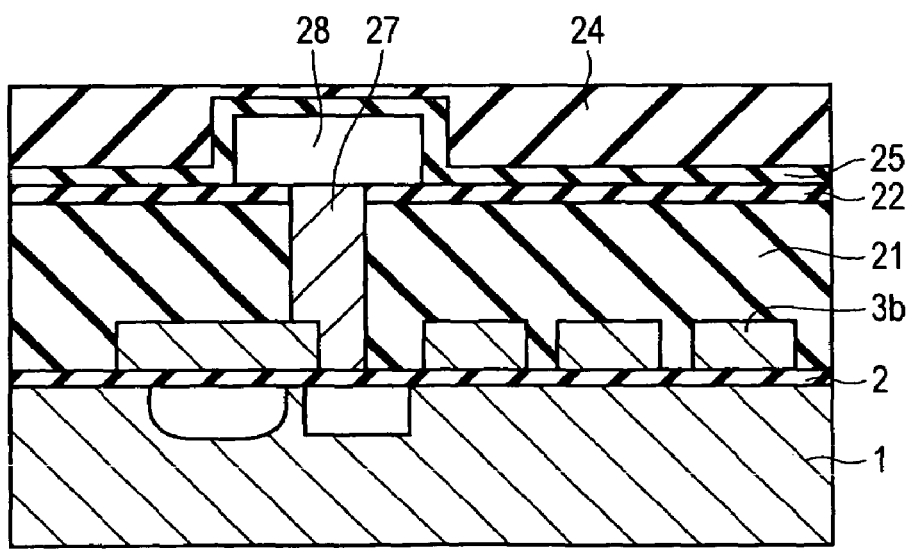

FIG. 1 is a section view showing a main portion of a solid-state image pickup element, FIG. 2 is a plan view, and FIG. 3 is a plan view of a main portion of an imaging region. FIG. 1 is a view showing the section taken along the line A-A of FIG. 3, and that taken along the line B-B of FIG. 2. FIG. 3 is an enlarged view of the imaging region 100 of FIG. 2, and FIGS. 4A and 4B are sectional views of main portions correspondingly showing an imaging section and a peripheral circuit section, respectively. As shown in FIGS. 4A and 4B, the solid-state image pickup element is characterized in that an intralayer lens 20 formed on a photoelectric converting portion is formed below a wiring layer 28 configuring a wiring portion of the peripheral circuit section. The thickness of the intralayer lens can be adjusted without being affected by the thickness of a passivation film 25 of the wiring portion. The reference numeral 27 denotes a contact plug connected to a gate of a transistor of the peripheral circuit section. The upper layer of the wiring layer 28 is covered with a silicon oxide film functioning as a planarizing layer which, in the imaging section, configures the foundation of a color filter layer 50, and, in the peripheral circuit section, functions as a passivation film.

A light blocking film 7 in which an opening is formed in a region corresponding to a photodiode 30 serving as a photoelectric converting portion is disposed above the imaging section of the solid-state image pickup element. A convex inferior portion 22 formed by a silicon nitride film, a planarizing layer 25, a convex superior portion 23, a planarizing layer 24, the color filter 50, a planarizing layer 70, and a microlens 60 are sequentially stacked on the light blocking film via a planarizing layer 21 made of a BPSG film.

As shown in the schematic plan view of FIG. 2, the solid-state image pickup element chip comprises the imaging region 100 configured by photodiodes and a charge transferring portion, and a peripheral circuit section 200 such as an amplifier which is formed in the periphery of the region, on the semiconductor substrate. In a peripheral edge portion, pad portions 300 are configured as external connecting terminals. As shown in FIG. 1, plural photodiodes 30 are formed in p-wells 12 which are separated from one another by an element separating region 11, and the charge transferring portions 40 which transfer charges detected from the photodiodes are formed in a meandering form between the photodiodes 30. Although not shown in FIG. 3, charge transfer channels 14 through which signal charges transferred by the charge transferring portions 40 are moved are formed similarly in a meandering form in a direction crossing the direction along which the charge transferring portions 40 elongate.

In the solid-state image pickup element, as shown in FIG. 1, a first layer electrode 3a and a second layer electrode 3b which are arranged with interposing therebetween an inter-electrode insulating film 4 made of a silicon oxide film 4a and an HTO film 4b are formed via the gate oxide film 2 on the surface of each of the charge transferring portions 40, thereby constituting a charge transfer electrode. Each of The photodiodes 30 is formed by an n-type impurity region 31 which cooperates with the p-well 12 to form a pn junction, and a heavily doped p-type impurity region which is formed on the surface of the n-type impurity region 31, and which functions as a surface potential adjusting layer 32. The gate oxide film 2 is configured by a stacked structure (ONO) film including: a bottom oxide film 2a made of a silicon oxide (SiO) film; a silicon nitride (SiN) film 2b; and a top oxide film 2c made of a silicon oxide (SiO) film. An over-drain buffer layer 13 made of a p-type semiconductor layer is formed below the p-well 12, so that, when a voltage is applied, charges can be drained.

The antireflection film 6 made of a silicon nitride film having a thickness of 30 nm is formed above the first layer electrode 3a and the second layer electrode 3b via a silicon oxide film 5. On the film, a thin tungsten film which functions as the light blocking layer 7, which has an opening in a light receiving region of the photodiode 30, and which has a thickness of 200 nm is formed via a titan nitride layer (not shown) which is formed by the sputtering method, and which has a thickness of 50 nm. The tungsten thin film is covered by an insulating layer 21 formed by a silicon oxide film 9 for preventing contamination due to a BPSG film, and a BPSG film. The intralayer lens in the upper layer is as described above.

Next, steps of forming the charge transfer electrode in the production steps of the solid-state image pickup element will be described with reference to FIGS. 5A to 5C. In this example, ion implantation is performed in order to form the n-type impurity region 31 for forming a photodiode region, the p-type impurity diffusion region functioning as the surface potential adjusting layer 32, and the n-type impurity region functioning as the transfer channel 14 shown in FIG. 1, and thereafter a gate oxide film and a gate electrode are formed. For the sake of simplicity, the photodiode region and the transfer channel which are formed in the semiconductor substrate are omitted in the following steps.

Figure 5A:
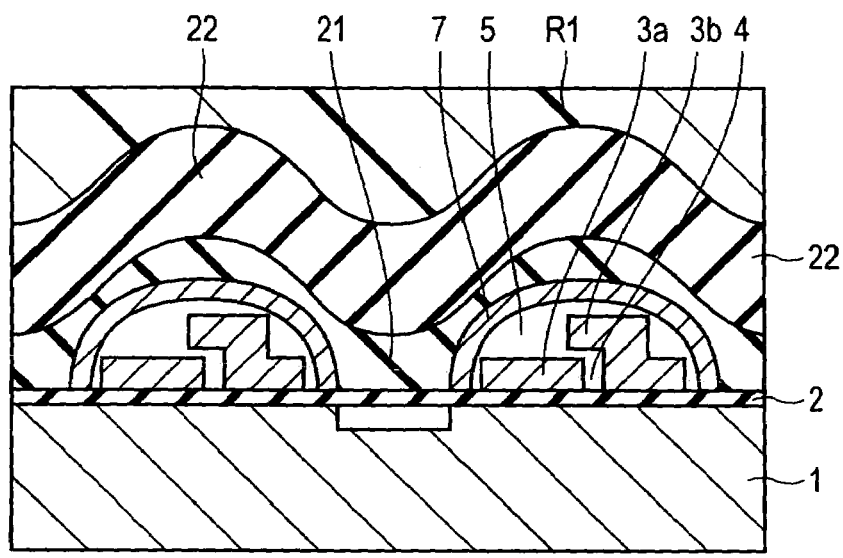
FIGS. 5A to 5C are views showing steps of producing the solid-state image pickup element of Embodiment 1 of the invention.

As shown in FIG. 5A, after the steps of forming the gate oxide film 2, the first layer electrode 3a, the inter-electrode insulating film 4, and the second layer electrode 3b, the insulating film 5 and the silicon nitride film 6 are formed, the light blocking layer 7 made of the tungsten film which is opened in the photodiode 30 is then formed, and the BPSG film serving as the insulating film 21 is thereafter grown via the silicon oxide film 9 (not shown in the figure, see FIG. 1). The films are fluidized by reflow to obtain a desired shape. In this case, a gate electrode of a MOSFET of an amplifier portion in the peripheral circuit section is formed in the same step as the second layer electrode 3b.

Figure 5B:
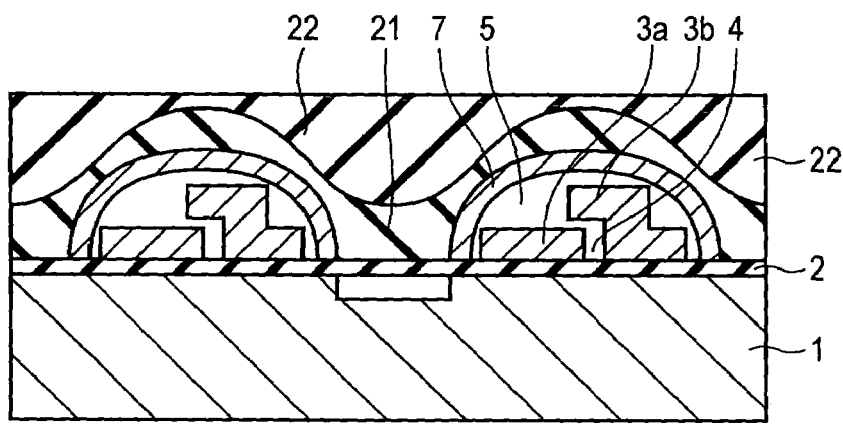

As shown in FIG. 5B, a resist is applied thereon, and an etching back process and a planarizing process are performed to form the concave lens 22.

In the peripheral circuit section, thereafter, a contact hole is formed so as be opened in the inter-layer film (22) formed in the same step as the concave lens, the insulating film 21, the silicon oxide film 9, and the like, the contact hole is filled with tungsten to form the contact plug.

Figure 5C:
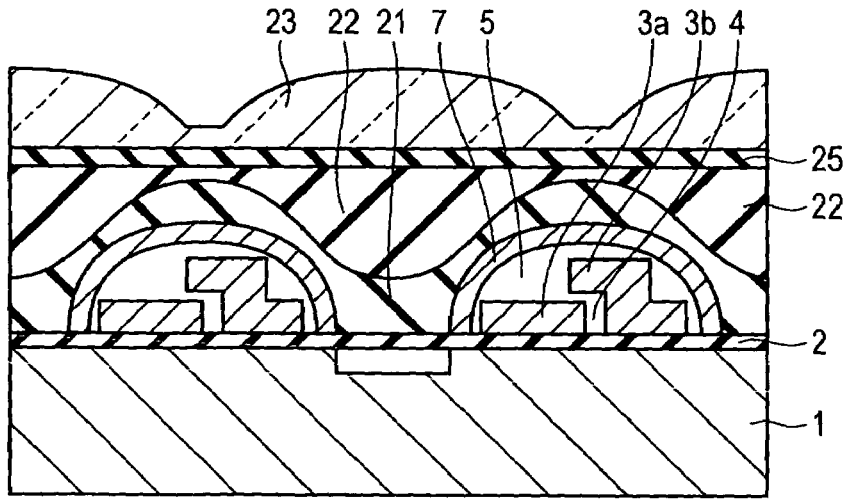

As shown in FIG. 5C, therefore, the planarizing layer 25 is formed, and a thin film of a high-refractive index material such an SiN film (refractive index n=1.9 to 2.0) is formed on the layer. Thereafter, a patterning process is performed so that the upper face is formed as a convex portion configured by a curved face, thereby forming the convex superior portion 23. In this case, in advance of the formation of the planarizing layer 25, the contact plug is formed in the peripheral circuit section, and functions as a passivation film.

Then, the planarizing layer 24, the color filter 50, the planarizing layer 70, and the microlens 60 are formed in the usual method, with the result that the solid-state image pickup element shown in FIGS. 1 to 4 is formed.

In the thus formed solid-state image pickup element, the thickness of the intralayer lens can be adjusted without depending on the thickness of the wiring layer of the peripheral circuit section, and hence the optical design can cope with more conditions. When the distance to the light receiving face is adjusted, it is possible to expect an improvement of F-value dependence, an enhancement of the sensitivity, and a reduction of smear. Furthermore, an enhancement of the reliability can be attained simply by changing the order of the production steps. In the embodiment, the convex superior portion is formed above the plug, and used as a passivation film, and therefore the convex superior portion can be formed without increasing the number of production steps.

The plug which is to be connected to the gate electrode of the peripheral circuit section is formed in an upper layer portion. Even when various plasma steps such as plasma CVD and plasma etching are used, therefore, gate destruction caused by plasma charging due to the antenna effect can be suppressed, and the reliability can be enhanced. In the Embodiment 1, the light blocking layer 7 and the wiring layer 28 were formed in the separate steps, however, they may be formed in the same step.

Embodiment 2

In Embodiment 1 above, the convex superior portion is formed in an upper layer of the plug, and used as a passivation film. In the embodiment, a wiring portion in the peripheral circuit section is formed in an upper layer of the convex superior portion serving as an intralayer convex lens. In other words, the intralayer lens comprises a convex inferior portion serving as an intralayer concave lens 22 and a convex superior portion serving as an intralayer convex lens 23, and in an upper layer of them, the plug 27 and the wiring layer 28 constituting the wiring portion are formed.

Figure 6A:
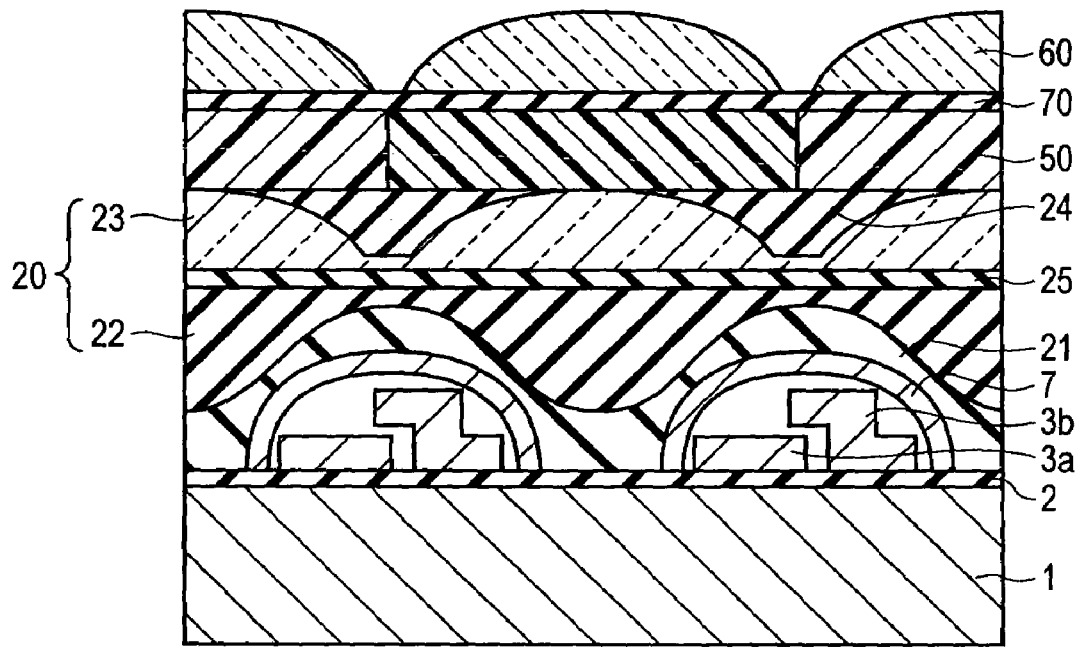
FIGS. 6A and 6B are diagrams showing a solid-state image pickup element of Embodiment 2 of the invention.
Figure 6B:
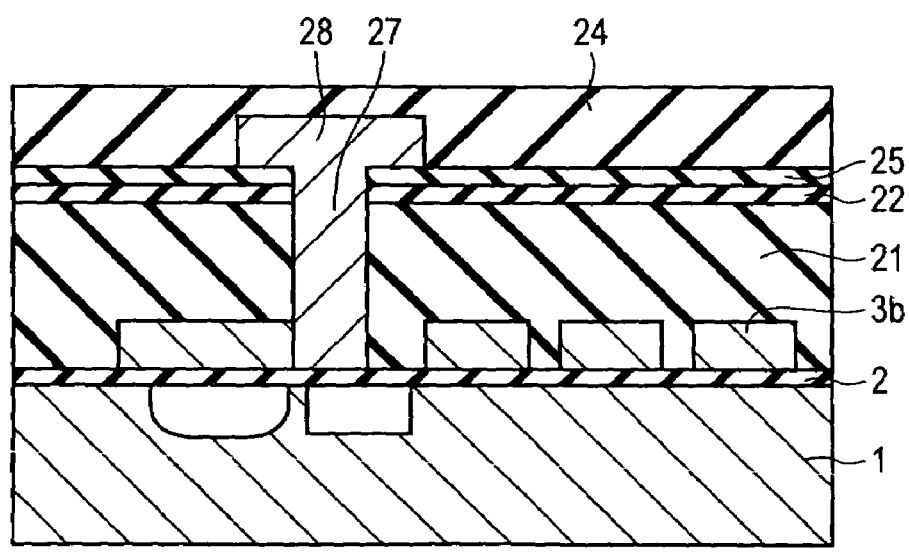

Namely, as shown in FIGS. 6A and 6B, the plug 27 is formed so as to penetrate from an upper layer of the intralayer convex lens 23 to the passivation film 25 (planarizing layer), the intralayer concave lens 22, and the insulation layer 21 made of a BPSG film. According to this structure, the layers which are formed above the plug 27 and the wiring layer 28 are the planarizing layer (protective layer) 24 and the planarizing layer 70. One of color filters may be caused to remain in the peripheral circuit section. FIGS. 6A and 6B are sectional views of the imaging section and the peripheral circuit section, and correspond to FIGS. 4A and 4B on the Embodiment 1, respectively. The other configuration is formed in the same manner as Embodiment 1, and hence the description is omitted.

In the above-mentioned embodiment, the plug 27 and the wiring layer 28 were formed in the separate steps, however, they may be formed in the same step.

According to the configuration, also when the convex superior portion is configured by a silicon nitride film by the plasma CVD method, plasma charging exerts no influence, both the convex inferior portion and the convex superior portion can be thinned without any restriction, and there is no fear that the wiring portion is exposed by etching back.

Embodiment 3

Figure 7:
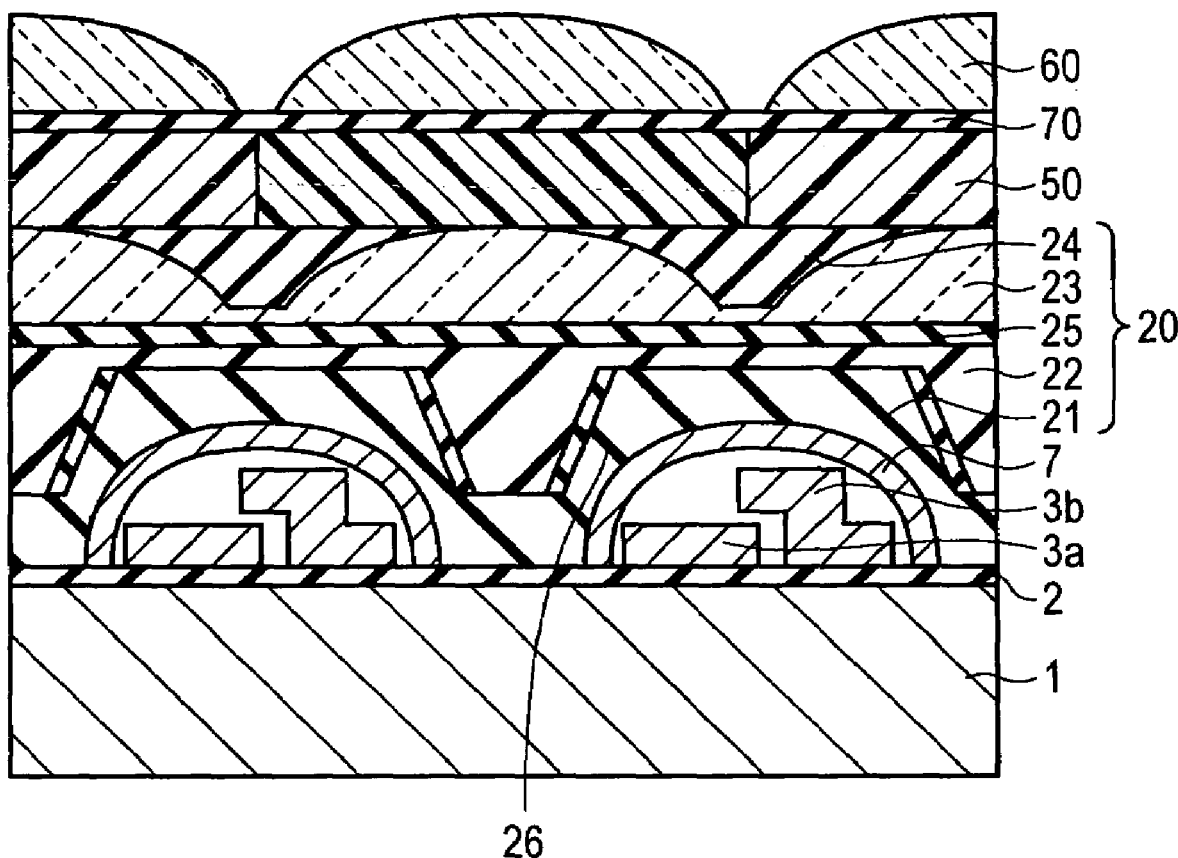
FIG. 7 is a diagram showing a solid-state image pickup element of Embodiment 3 of the invention.

The embodiment is characterized in that, as shown in FIG. 7, a light blocking film 26 made of a tungsten layer is formed on the sidewall of the convex inferior portion 22 formed in Embodiment 1.

In the process of patterning the light blocking film, anisotropic etching is employed. Therefore, the patterning process can be performed so that the light blocking film remains on the sidewall of the photodiode portion, and it is possible to form a solid-state image pickup element in which the light converging property is enhanced, and which is highly reliable. In the embodiment also, the other configuration is formed in the same manner as Embodiment 1, and hence the description is omitted.

In the above-mentioned embodiment, the charge transporting device (CCD) is used as the imaging section, however, the invention is applicable to an embodiment in which a CMOS element is used for the imaging section.

As described above, according to the solid-state image pickup element of the invention, the thickness of the intralayer lens can be adjusted without depending on the thickness of the wiring portion of the peripheral circuit section, and hence the optical design can cope with more conditions.

When the distance to a light receiving face is adjusted, it is possible to expect an improvement of F-value dependence, an enhancement of the sensitivity, and a reduction of smear.

According to the method of producing a solid-state image pickup element of the invention, an enhancement of the reliability, and an improvement of the height of a wiring layer can be attained simply by changing the order of production steps.

As described above, according to the invention, it is possible to form a solid-state image pickup element in which the height of an intralayer lens can be freely adjusted, which is thin, and which is highly reliable. Therefore, the solid-state image pickup element is useful in a small communication apparatus such as a mobile telephone.

The entire disclosure of each and every foreign patent application from which the benefit of foreign priority has been claimed in the present application is incorporated herein by reference, as if fully set forth.

What is claimed is:

1. A solid-state image pickup element comprising:
a semiconductor substrate;
an imaging section comprising a photoelectric converting portion that generates an electric charge, formed on the semiconductor substrate;
an intralayer lens formed in an upper layer of the imaging section;
a vertical transfer channel;
a horizontal transfer channel; and
a peripheral circuit section including a wiring portion, formed on the semiconductor substrate,
wherein the vertical transfer channel transfers the electric charge generated in the imaging section to the horizontal transfer channel,
the horizontal transfer channel transfers the electric charge transferred from the vertical transfer channel to the peripheral circuit section,
the peripheral circuit section process an output of the electric charge transferred from the horizontal transfer channel, and
the intralayer lens includes a convex superior portion formed in an upper layer and a convex inferior portion formed in a lower layer and at least part of the lower layer of the intralayer lens is formed below a wiring portion in the peripheral circuit section.

2. A solid-state image pickup element according to claim 1, wherein
the intralayer lens comprises a convex inferior portion and a convex superior portion, and
the wiring portion of the peripheral circuit section is formed above of the convex inferior portion, and is formed in a lower layer of the convex superior portion.

3. A solid-state image pickup element according to claim 1, wherein the intralayer lens comprises a convex inferior portion and a convex superior portion, and
the wiring portion of the peripheral circuit section is formed in an upper layer of the convex inferior portion and the convex superior portion.

4. A solid-state image pickup element according to claim 1, further comprising a plug directly connect to a gate electrode of the peripheral circuit section,
wherein the wiring portion is connect to a gate electrode of the peripheral circuit section via the plug.

5. A solid-state image pickup element according to claim 1, wherein the intralayer lens comprises a convex inferior portion, and
a sidewall of the convex inferior portion is covered by a light blocking film.

6. A solid-state image pickup element according to claim 2, wherein a passivation film which covers the wiring portion in the peripheral circuit configures the convex superior portion.

* * * * *